United States Patent
Wu et al.

(10) Patent No.: US 11,134,581 B2
(45) Date of Patent: Sep. 28, 2021

(54) ELECTRONIC DEVICE AND CASE THEREOF

(71) Applicant: Wistron Corp., New Taipei (TW)

(72) Inventors: Yu-Jian Wu, New Taipei (TW); Zhi-Tao Yu, New Taipei (TW); Wen Huang, New Taipei (TW); Chia-Hsin Liu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/708,808

(22) Filed: Dec. 10, 2019

(65) Prior Publication Data

US 2021/0007236 A1    Jan. 7, 2021

(30) Foreign Application Priority Data

Jul. 1, 2019    (CN) .......................... 201910584559.6

(51) Int. Cl.
    *H05K 7/14*    (2006.01)
    *G06F 1/18*    (2006.01)

(52) U.S. Cl.
CPC ........... *H05K 7/1487* (2013.01); *G06F 1/187* (2013.01); *H05K 7/1489* (2013.01); *H05K 7/1492* (2013.01); *G06F 2200/1639* (2013.01)

(58) Field of Classification Search
CPC .. H05K 7/1489; H05K 7/1487; H05K 7/1474; H05K 7/1452; H05K 7/12; G06F 1/187; G06F 2200/1639; H04K 7/14
See application file for complete search history.

(56) References Cited

U.S. PATENT DOCUMENTS

| | | | |
|---|---|---|---|
| 6,244,953 B1 * | 6/2001 | Dugan | H05K 7/20172 361/695 |
| 7,352,574 B2 * | 4/2008 | Chen | G06F 1/20 165/104.34 |
| 9,918,399 B1 * | 3/2018 | Deng | H05K 7/1487 |
| 10,219,402 B1 * | 2/2019 | Su | H05K 7/20727 |
| 10,398,032 B1 * | 8/2019 | Bailey | G06F 13/4068 |
| 2005/0219833 A1 * | 10/2005 | Wu | G06F 1/184 361/829 |

(Continued)

FOREIGN PATENT DOCUMENTS

| | | |
|---|---|---|
| CN | 103970713 A | 8/2014 |
| CN | 104460890 A | 3/2015 |

(Continued)

*Primary Examiner* — Stephen S Sul
*Assistant Examiner* — Michael A Matey

(57) ABSTRACT

A case adapted to be selectively connected to a first interface module, a second interface module and a third interface module is provided. The case includes a substrate. The substrate includes a first connection area and a second connection area. The first connection area is adjacent to the second connection area. The first connection area includes a first post. The second connection area includes a second post and a third post. In a first state, the first interface module is disposed in the first connection area. The second interface module is disposed in the second connection area. In a second state, the third interface module is disposed in the first connection area and the second connection area. The case is adapted to be selectively connected to different types of storage units.

18 Claims, 17 Drawing Sheets

(56) References Cited

U.S. PATENT DOCUMENTS

| | | | | |
|---|---|---|---|---|
| 2007/0130879 A1* | 6/2007 | Chang | G06F 1/187 | 52/750 |
| 2007/0153477 A1* | 7/2007 | Liang | H05K 7/20172 | 361/695 |
| 2013/0107436 A1* | 5/2013 | Li | G06F 1/188 | 361/679.4 |
| 2013/0258620 A1* | 10/2013 | Qiu | G11B 33/128 | 361/759 |
| 2013/0279975 A1* | 10/2013 | Yang | H05K 7/12 | 403/343 |
| 2014/0003010 A1* | 1/2014 | Lee | H05K 7/1485 | 361/759 |
| 2014/0204525 A1* | 7/2014 | Pecone | G06F 1/187 | 361/679.33 |
| 2015/0077920 A1* | 3/2015 | Zhu | H05K 7/1487 | 361/679.31 |
| 2015/0083676 A1* | 3/2015 | Peng | G06F 1/187 | 211/41.12 |
| 2015/0124393 A1* | 5/2015 | Lin | G06F 1/187 | 361/679.33 |
| 2016/0041590 A1* | 2/2016 | Yu | G06F 1/185 | 361/679.32 |
| 2016/0044820 A1* | 2/2016 | Xu | H05K 7/20727 | 361/679.31 |
| 2016/0205802 A1* | 7/2016 | Kohler | H05K 7/1439 | 361/679.02 |
| 2016/0209891 A1* | 7/2016 | Peng | G06F 1/187 | |
| 2017/0086332 A1* | 3/2017 | Jaskela | H05K 7/1487 | |
| 2017/0371383 A1* | 12/2017 | Yang | F16B 33/002 | |
| 2019/0124760 A1* | 4/2019 | Duffy | H05K 1/0271 | |
| 2019/0373746 A1* | 12/2019 | Wu | H05K 5/0286 | |
| 2019/0373754 A1* | 12/2019 | Norton | H05K 7/1422 | |
| 2020/0229311 A1* | 7/2020 | Wu | H05K 5/0013 | |

FOREIGN PATENT DOCUMENTS

| | | |
|---|---|---|
| CN | 104460891 A | 3/2015 |
| TW | I384930 B1 | 2/2013 |
| WO | WO 2016/065741 A1 | 5/2016 |

\* cited by examiner

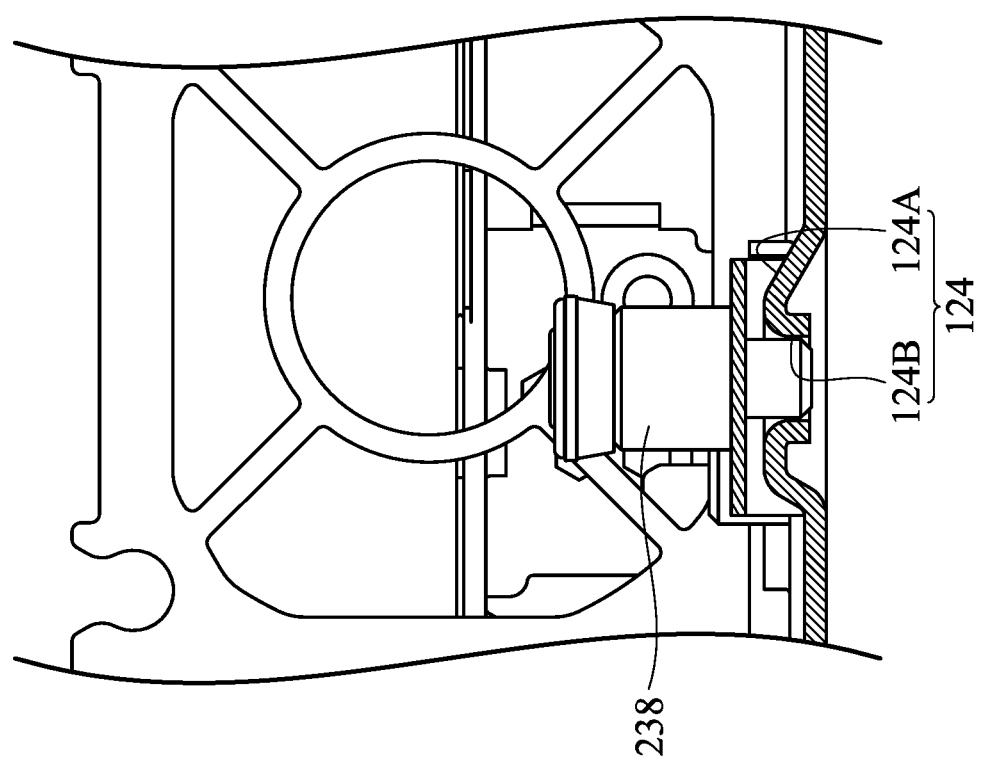

ELECTRONIC DEVICE AND CASE THEREOF

CROSS REFERENCE TO RELATED APPLICATIONS

This Application claims priority of China Patent Application No. 201910584559.6, filed on Jul. 1, 2019, the entirety of which is incorporated by reference herein.

BACKGROUND OF THE INVENTION

Field of the Invention

The present invention relates to a case, and in particular to a case which is adapted to be selectively connected to different types of storage units.

Description of the Related Art

Only one type storage unit can be installed in a specific area of a conventional case. For example, due to the size difference between a hard disk (HDD) and a solid-state disk (SSD), a hard disk (HDD) and a solid-state disk (SSD) cannot be selectively installed in one single area inside a case. There is a huge difference between the size of an internal raid card, the size of an M.2 interface card, and the size of an enterprise and data center SSD.

BRIEF SUMMARY OF THE INVENTION

In one embodiment, a case adapted to be selectively connected to a first interface module, a second interface module, or a third interface module is provided. The case includes a substrate. The substrate includes a first connection area and a second connection area. The first connection area is adjacent to the second connection area. The first connection area comprises a first post. The second connection area comprises a second post and a third post. In a first state, the first interface module is disposed in the first connection area, and is connected to the first post. The second interface module is disposed in the second connection area, and is connected to the second post. In a second state, the third interface module is disposed in the first connection area and the second connection area, and is simultaneously connected to the first post and the third post.

In one embodiment, the case further comprises a fastener, wherein the second connection area comprises a fastening seat, and in the first state, the fastener passes through the second interface module and is affixed to the fastening seat.

In one embodiment, the second post is located between the first post and the third post.

In one embodiment, the third interface module comprises a through hole, and in the second state, the second post passes through the through hole.

In one embodiment, the first interface module comprises a first latch. The first connection area comprises a first wedging unit. The first wedging unit comprises a first inclined surface and a first abutting surface. During the connection of the first interface module to the first post in a first direction, the first latch is pushed by the first inclined surface. When the first interface module is completely connected to the first post, the first latch abuts the first abutting surface.

In one embodiment, the third interface module comprises a second latch. The second connection area comprises a second wedging unit. The second wedging unit comprises a second inclined surface and a second abutting surface. While the third interface module is being connected to the first post and the third post in a second direction, the second latch is pushed by the second inclined surface. When the third interface module is completely connected to the first post and the third post, the second latch abuts the second abutting surface, and the first direction is opposite the second direction.

In one embodiment, the first interface module comprises an internal raid card, and the second interface module comprises an M.2 interface card, and the third interface module comprises an SSD external card or an EDSFF external card.

In one embodiment, the substrate further comprises a riser card mounting area, wherein the riser card mounting area connects the first connection area and the second connection area, a riser card is selectively disposed in the riser card mounting area. In the first state, the riser card is disposed in the riser card mounting area, and the riser card is coupled to the first interface module.

In another embodiment, an electronic device is provided. The electronic device includes a case. The case comprises a substrate. The substrate comprises a first connection area and a second connection area. The first connection area is adjacent to the second connection area. The first connection area comprises a first post. The second connection area comprises a second post and a third post. In a first state, the electronic device further comprises a first interface module and a second interface module. The first interface module is disposed in the first connection area, and is connected to the first post, and the second interface module is disposed in the second connection area, and is connected to the second post. In a second state, the electronic device further comprising a third interface module. The third interface module is disposed in the first connection area and the second connection area, and is simultaneously connected to the first post and the third post.

In one embodiment, the substrate further comprises a storage unit mounting area, a first storage unit or a second storage unit is selectively disposed in the storage unit mounting area. In the first state, the electronic device comprises the first storage unit. The first storage unit is disposed in the storage unit mounting area and is coupled to the riser card. In a second state, the electronic device comprises the second storage unit. The second storage unit is disposed in the storage unit mounting area and is directly connected to the third interface module.

In one embodiment, the first storage unit comprises a hard disk, and the second storage unit comprises a solid-state disk.

In one embodiment, the second storage unit comprises a unit housing and a solid-state disk. The solid-state disk is disposed in the unit housing. The storage unit mounting area comprises a connection bracket. The unit housing is disposed in the connection bracket, and the solid-state disk is coupled to the third interface module.

In one embodiment, the unit housing further comprises an elastic sheet. The connection bracket comprises a bracket wedging portion. The elastic sheet is detachably connected to the bracket wedging portion.

Utilizing the case of the electronic device of the embodiment of the invention, the hard disk and the solid-state disk can be selectively disposed in the electronic device. The internal raid card, the M.2 interface card and the enterprise and data center SSD external card can be fastened conveniently in the well configured space inside the case of the electronic device. The molding cost of the case is decreased, and the space utilization inside the case of the electronic device is improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 5C shows a second latch of the embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
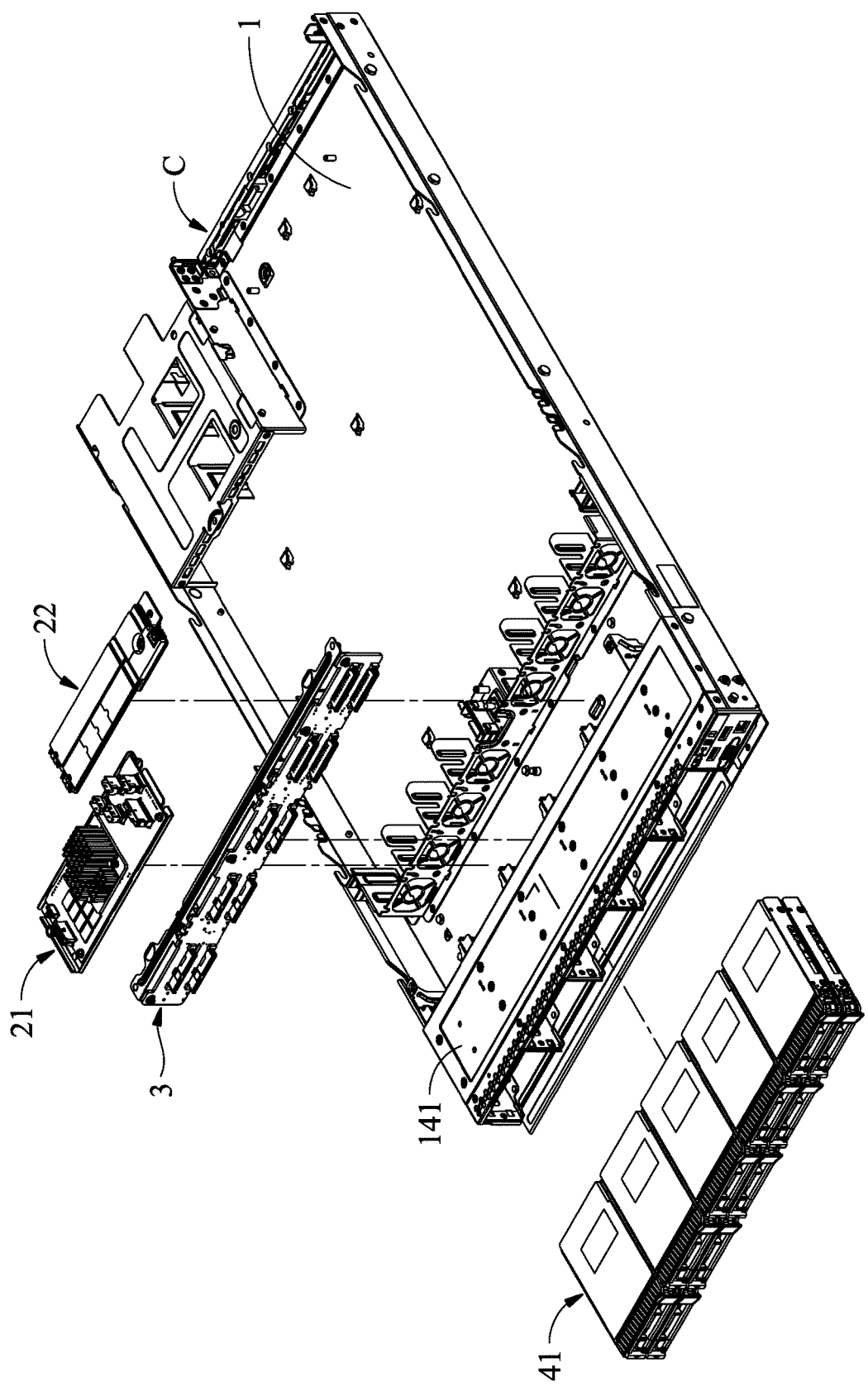
FIG. 1A shows an electronic device of an embodiment of the invention, wherein the electronic device is in a first state.
Figure 1B:
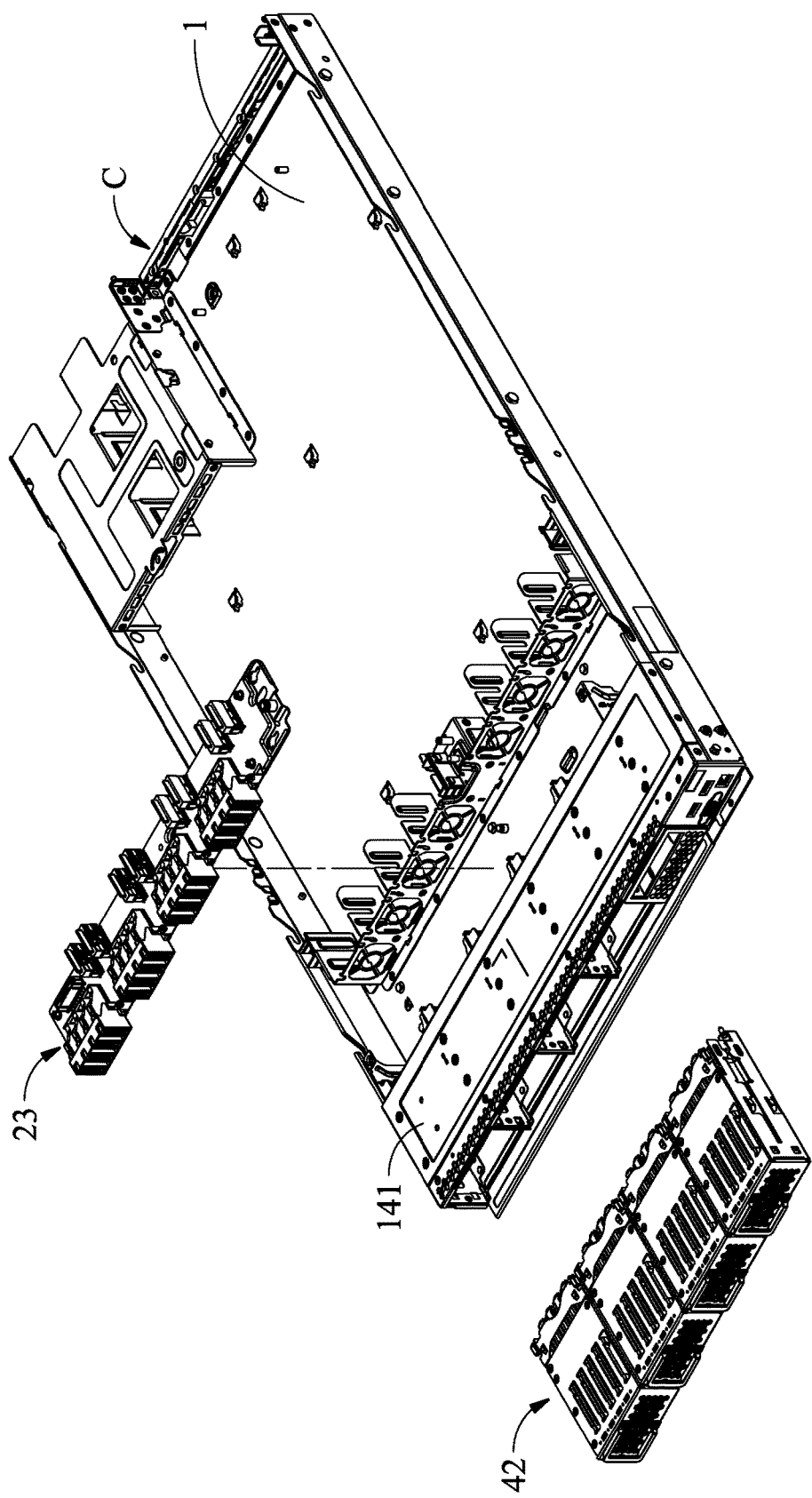
FIG. 1B shows the electronic device of the embodiment of the invention, wherein the electronic device is in a second state.
Figure 2:
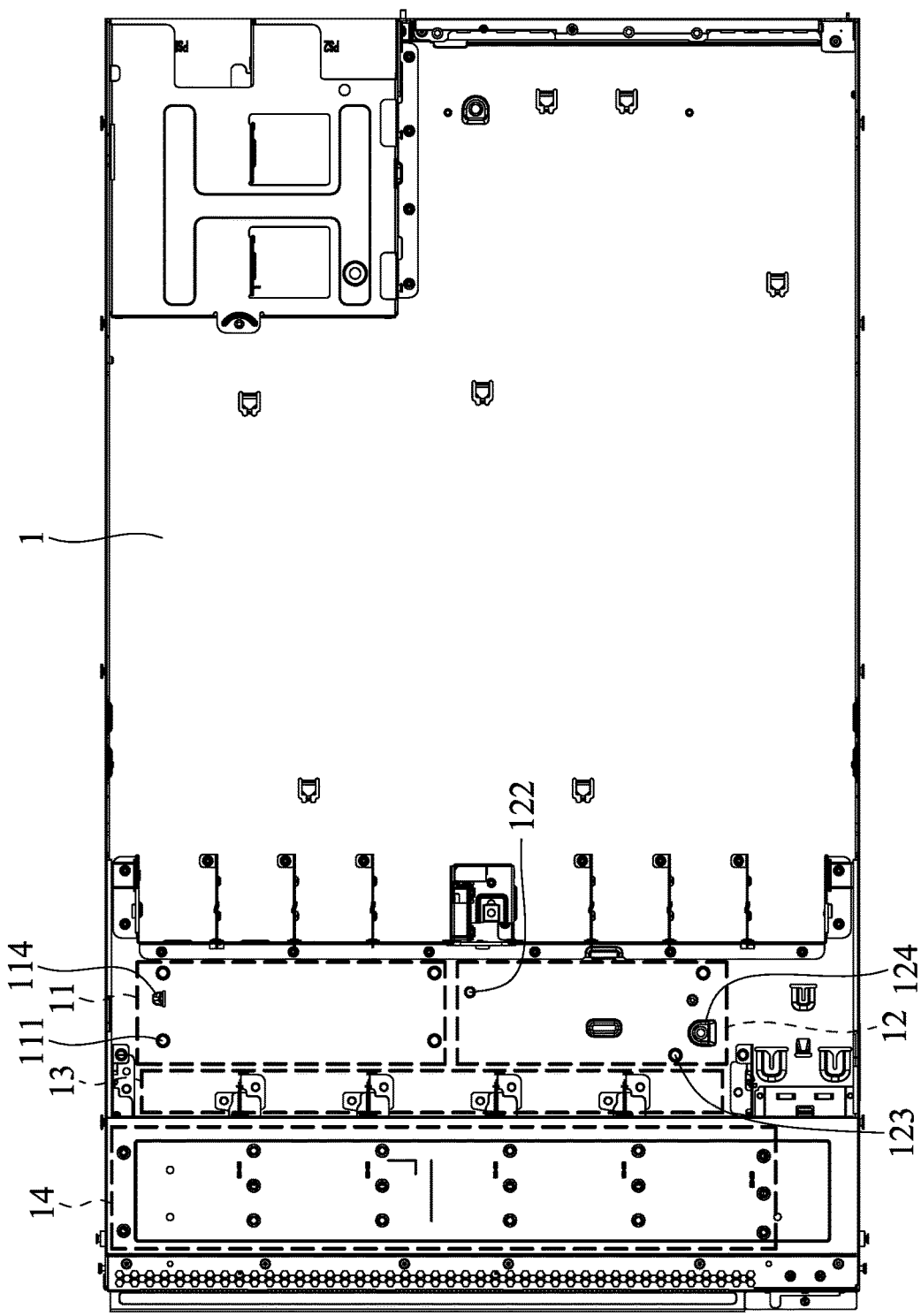
FIG. 2 shows the details of a case of the embodiment of the invention.

FIGS. 1A and 1B show an electronic device E of an embodiment of the invention, which includes a case C. FIG. 2 shows the details of the case of the embodiment of the invention. With reference to FIGS. 1A, 1B and 2, the case C comprises a substrate 1. The substrate 1 comprises a first connection area 11 and a second connection area 12. The first connection area 11 is adjacent to the second connection area 12. The first connection area 11 comprises a plurality of first posts 111. The second connection area 12 comprises a second post 122 and a plurality of third posts 123.

Figure 3A:
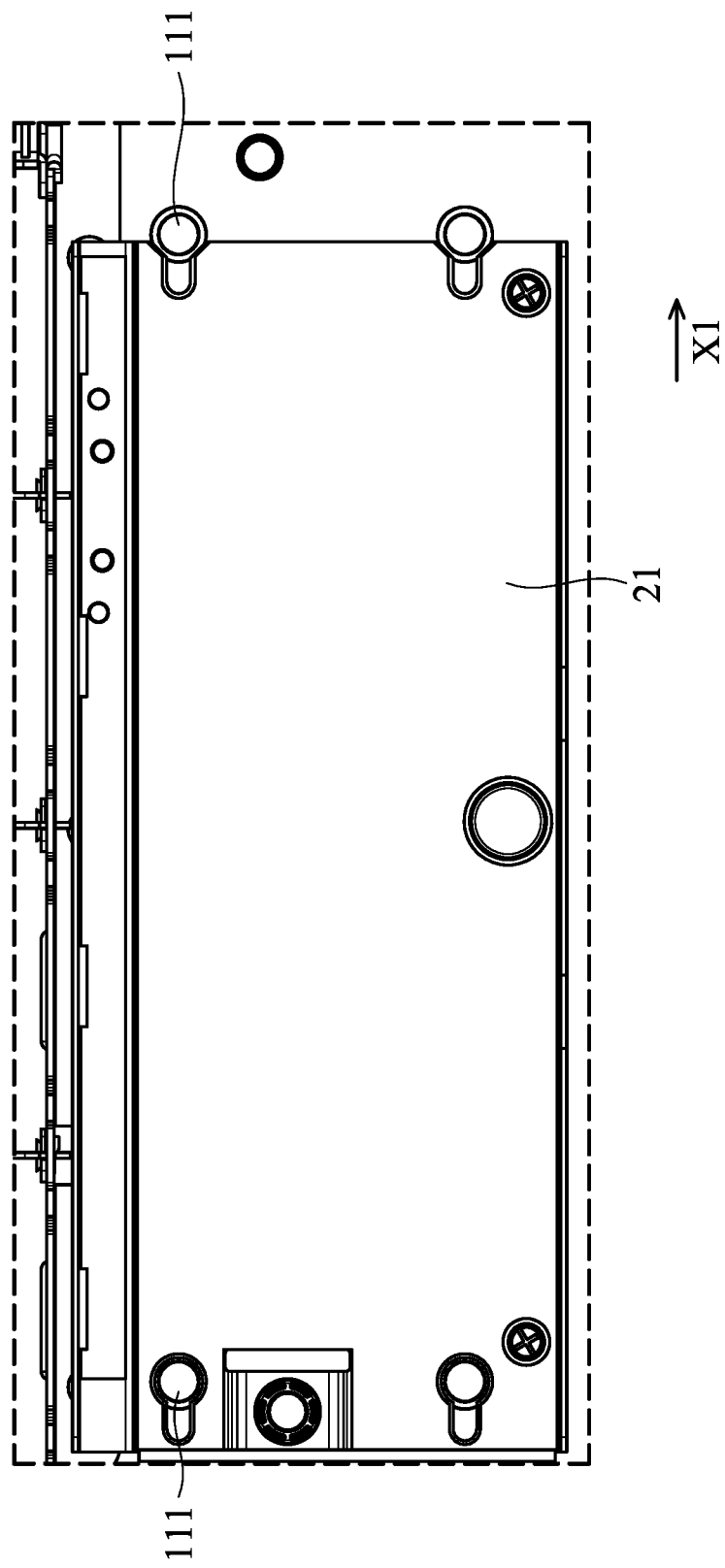
FIGS. 3A and 3B show the assembly process of a first interface module of the embodiment of the invention.
Figure 3B:
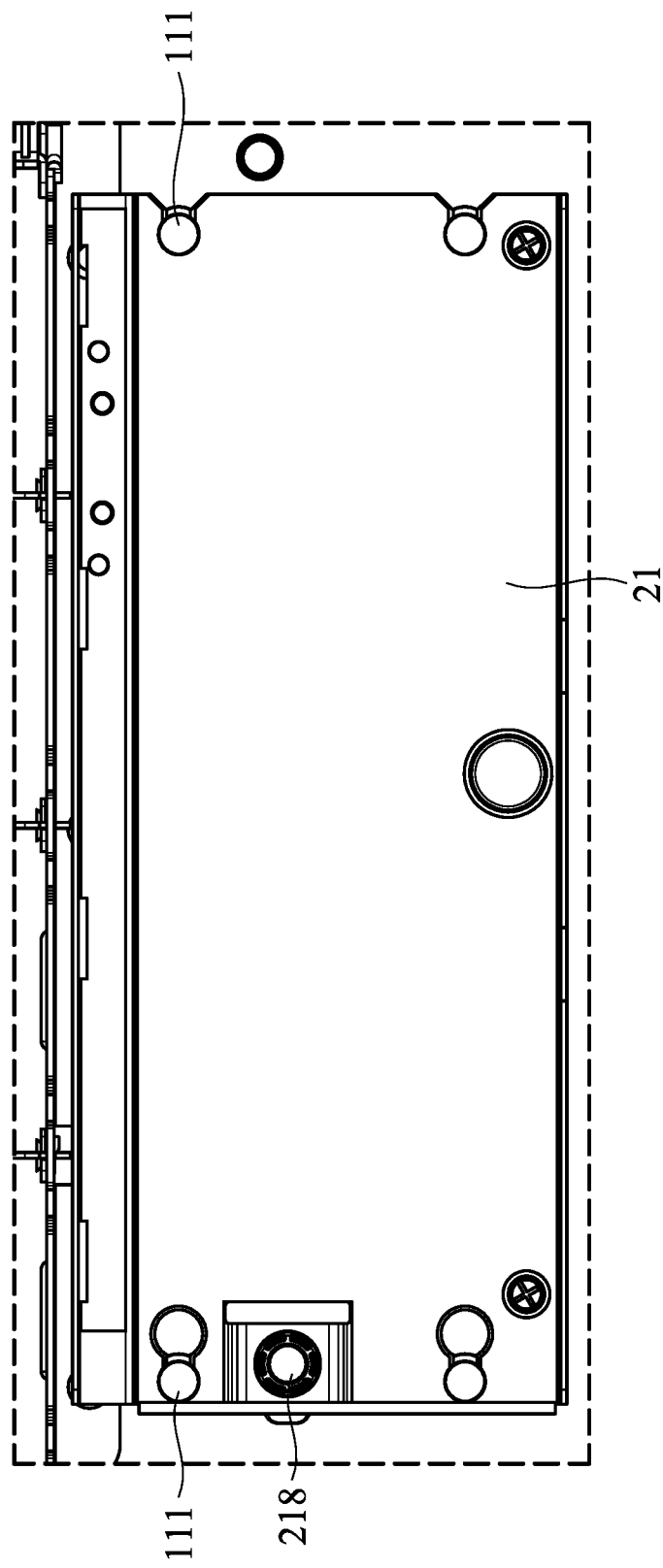
Figure 4A:
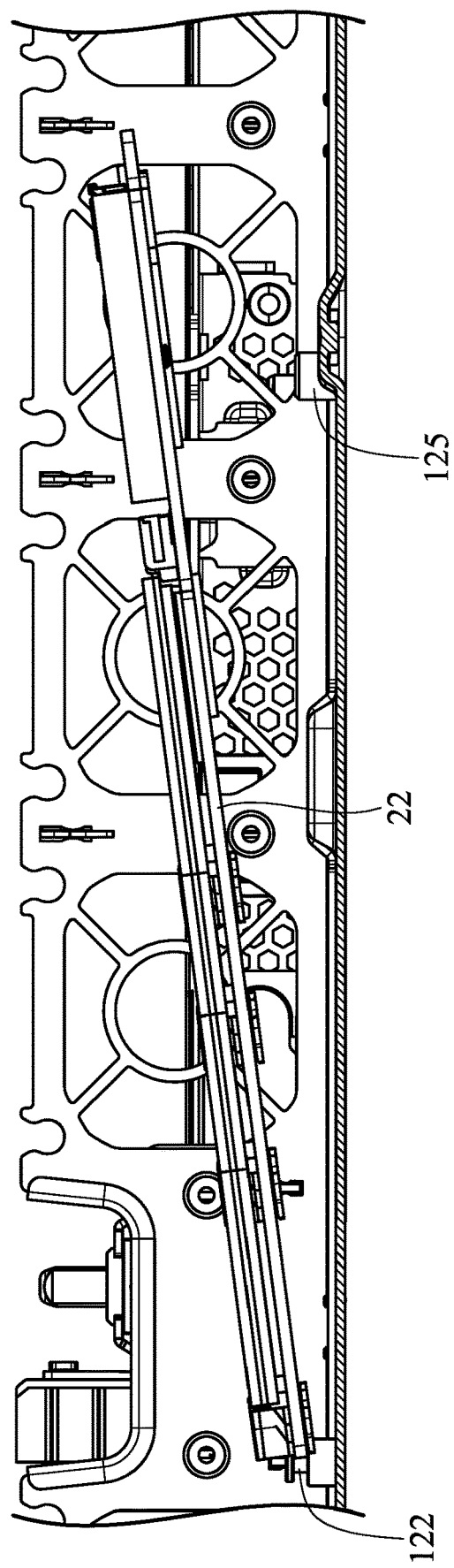
FIGS. 4A, 4B and 4C show the assembly process of a second interface module of the embodiment of the invention.
Figure 4B:
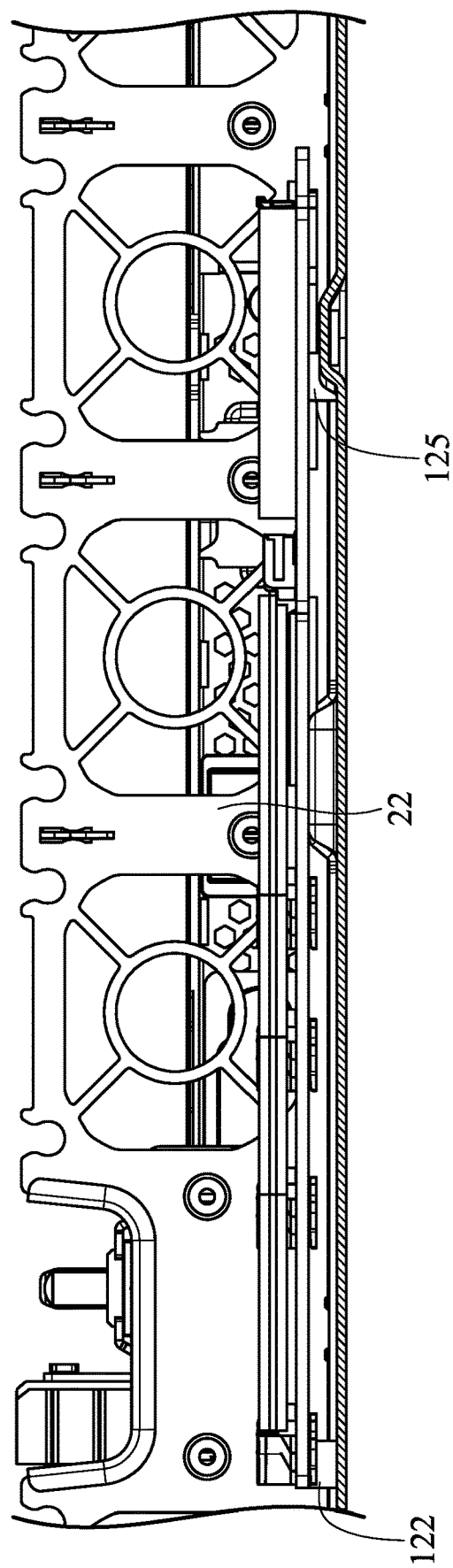
Figure 4C:
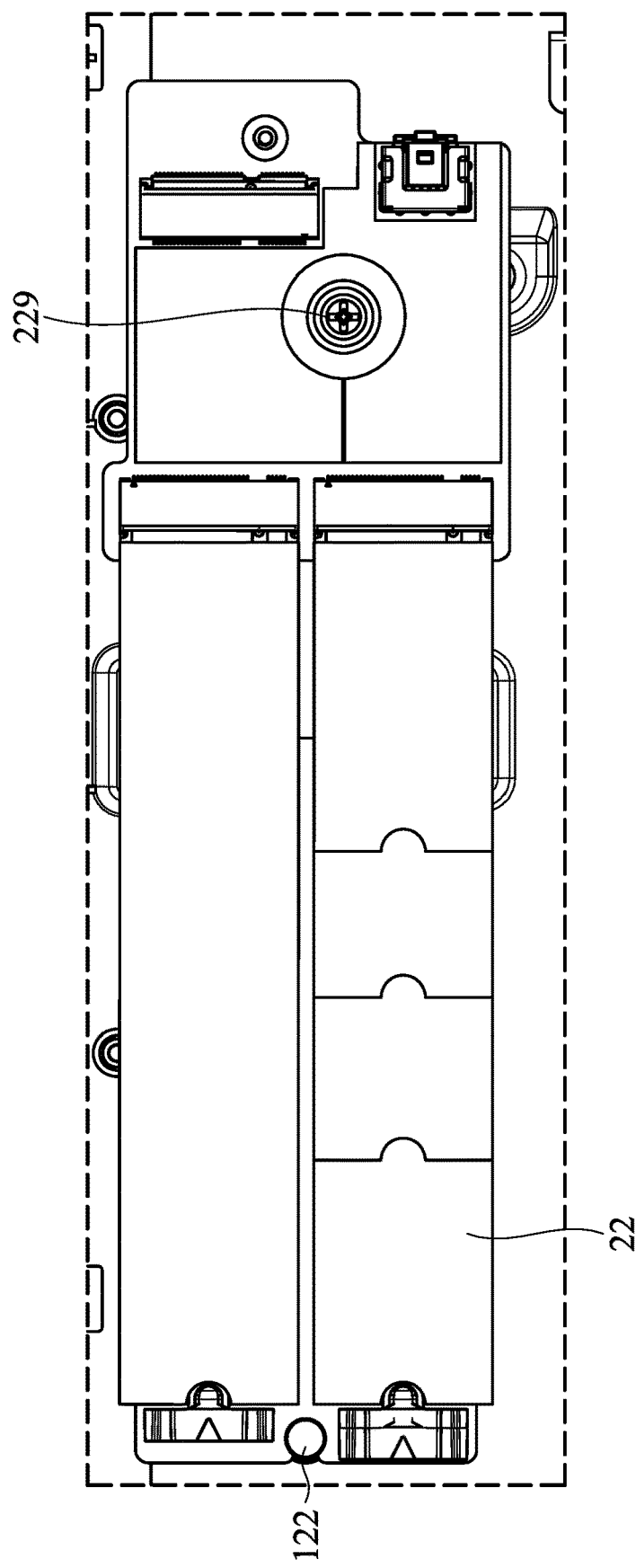

FIGS. 3A and 3B show the assembly process of a first interface module of the embodiment of the invention. FIGS. 4A, 4B and 4C show the assembly process of a second interface module of the embodiment of the invention. With reference to FIGS. 1A, 3A, 3B, 4A, 4B and 4C, in a first state (FIG. 1A), the electronic device E further comprises the first interface module 21 and the second interface module 22. The first interface module 21 is disposed in the first connection area 11, and is connected to the first posts 111 (FIGS. 3A and 3B). The second interface module 22 is disposed in the second connection area 12, and is connected to the second post 122 (FIGS. 4A, 4B and 4C).

Figure 5A:
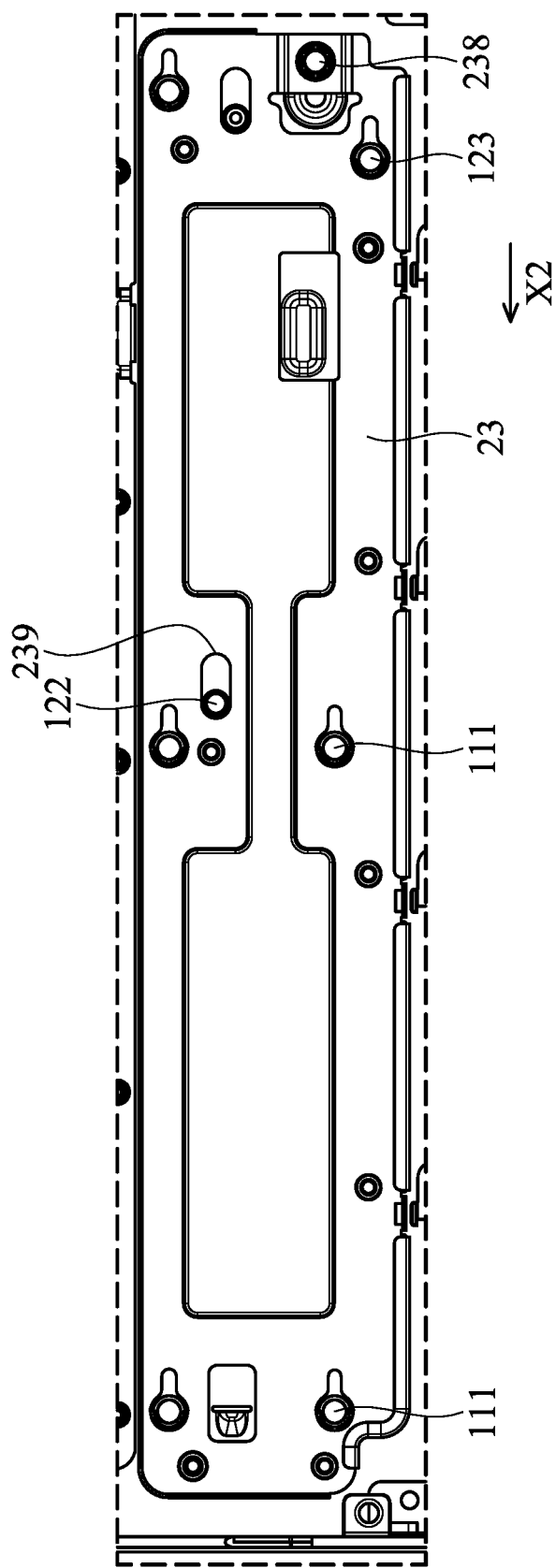
FIGS. 5A and 5B show the assembly process of a third interface module of the embodiment of the invention.
Figure 5B:
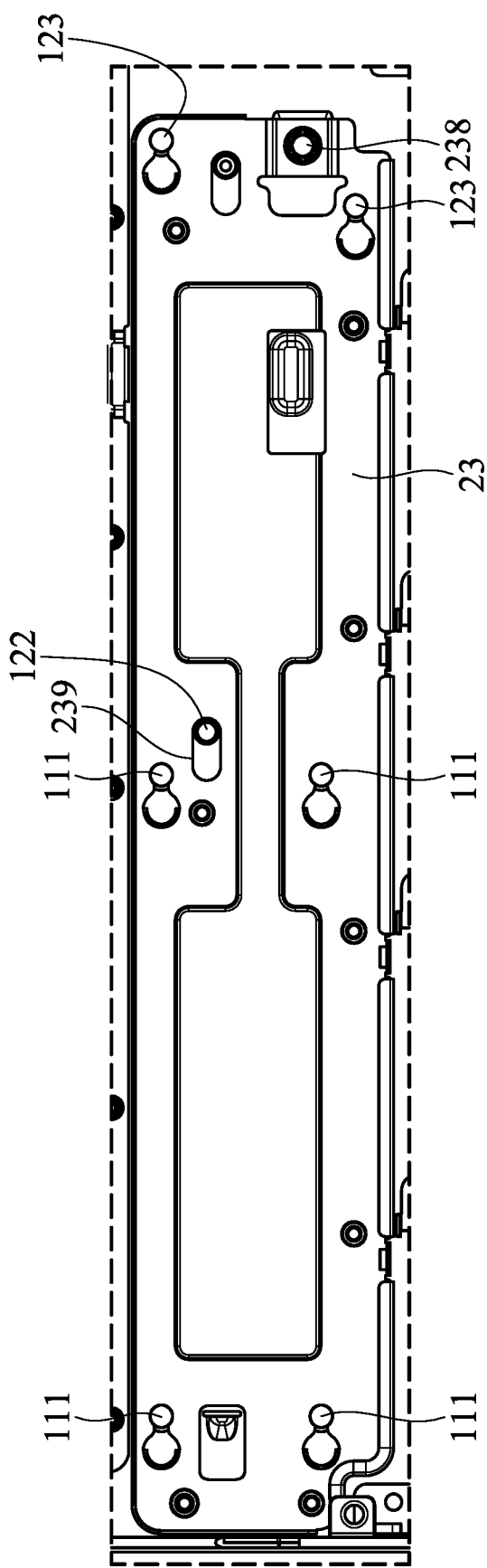

FIGS. 5A and 5B show the assembly process of a third interface module of the embodiment of the invention. With reference to FIGS. 1B, 5A and 5B, in a second state (FIG. 1B), the electronic device E further comprising a third interface module 23. The third interface module 23 is disposed in the first connection area 11 and the second connection area 12, and is simultaneously connected to the first posts 111 and the third posts 123.

With reference to FIGS. 4A, 4B and 4C, in one embodiment, the case C further comprises a fastener 229. The second connection area 12 comprises a fastening seat 125. In the first state, the fastener 229 passes through the second interface module 22 and is affixed to the fastening seat 125.

With reference to FIG. 2, in one embodiment, the second post 122 is located between the first posts 111 and the third posts 123.

With reference to FIGS. 5A and 5B, in one embodiment, the third interface module 23 comprises a through hole 239. In the second state, the second post 122 passes through the through hole 239.

Figure 3C:
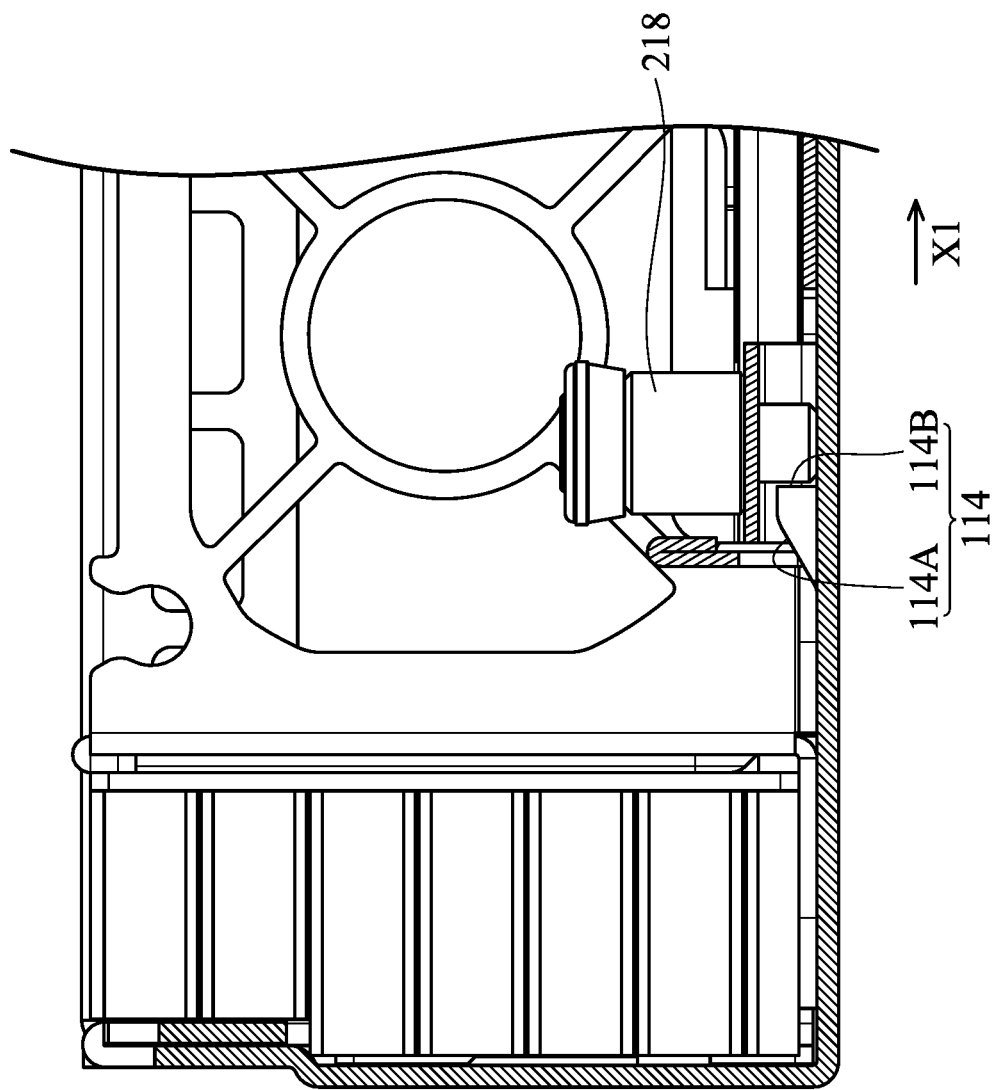
FIG. 3C shows a first latch of the embodiment of the invention.

FIG. 3C shows a first latch of an embodiment of the invention. With reference to FIGS. 2, 3A, 3B and 3C, in one embodiment, the first interface module 21 comprises the first latch 218. The first connection area 11 comprises a first wedging unit 114. The first wedging unit 114 comprises a first inclined surface 114A and a first abutting surface 114B. While the first interface module 21 is being connected to the first posts 111 in a first direction X1, the first latch 218 is pushed by the first inclined surface 114A. When the first interface module 21 is completely connected to the first posts 111, the first latch 218 abuts the first abutting surface 114B.

FIG. 5C shows a second latch of an embodiment of the invention. With reference to FIGS. 2, 5A, 5B and 5C, in one embodiment, the third interface module 23 comprises a second latch 238. The second connection area 12 comprises a second wedging unit 124. The second wedging unit 124 comprises a second inclined surface 124A and a second abutting surface 124B. During the connection of the third interface module 23 to the first posts 111 and the third posts 123 in a second direction X2, the second latch 238 is pushed upward by the second inclined surface 124A. When the third interface module 23 is completely connected to the first posts 111 and the third posts 123, the second latch 238 is moved downward to abut the second abutting surface 124B, and the first direction X1 is opposite the second direction X2.

In one embodiment, the first interface module 21 comprises an internal raid card, and the second interface module 22 comprises an M.2 interface card, and the third interface module 23 comprises an SSD external card or an EDSFF external card.

With reference to FIGS. 1A, 1B and 2, in one embodiment, the substrate 1 further comprises a riser card mounting area 13. The riser card mounting area 13 connects the first connection area 11 and the second connection area 12 simultaneously. A riser card 3 is selectively disposed in the riser card mounting area 13. In the first state (FIG. 1A), the riser card 3 is disposed in the riser card mounting area 13, and the riser card 3 is coupled to the first interface module 21. In the second state (FIG. 1B), the third interface module 23 covers at least a portion of the riser card mounting area 13.

With reference to FIGS. 1A, 1B and 2, in one embodiment, the substrate 1 further comprises a storage unit mounting area 14. A first storage unit 41 or a second storage unit 42 is selectively disposed in the storage unit mounting area 14. In the first state (FIG. 1A), the electronic device E comprises the first storage unit 41. The first storage unit 41 is disposed in the storage unit mounting area 14 and is coupled to the riser card 3. In a second state (FIG. 1B), the electronic device E comprises the second storage unit 42. The second storage unit 42 is disposed in the storage unit mounting area 14 and is directly connected to the third interface module 23.

In one embodiment, the first storage unit 41 comprises a hard disk, and the second storage unit 42 comprises a solid-state disk.

Figure 6A:
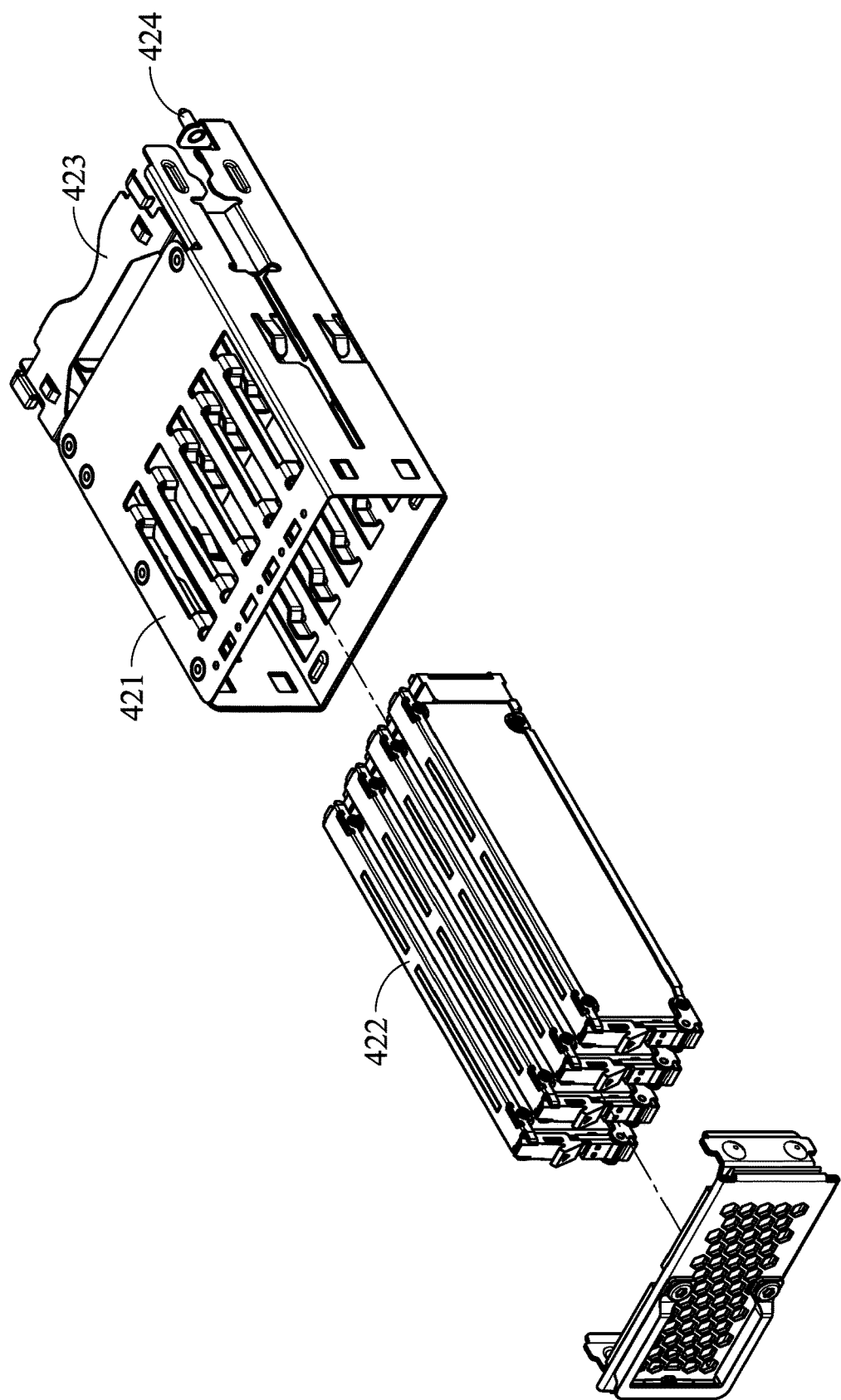
FIGS. 6A and 6B show the details of a second storage unit of the embodiment of the invention.
Figure 6B:
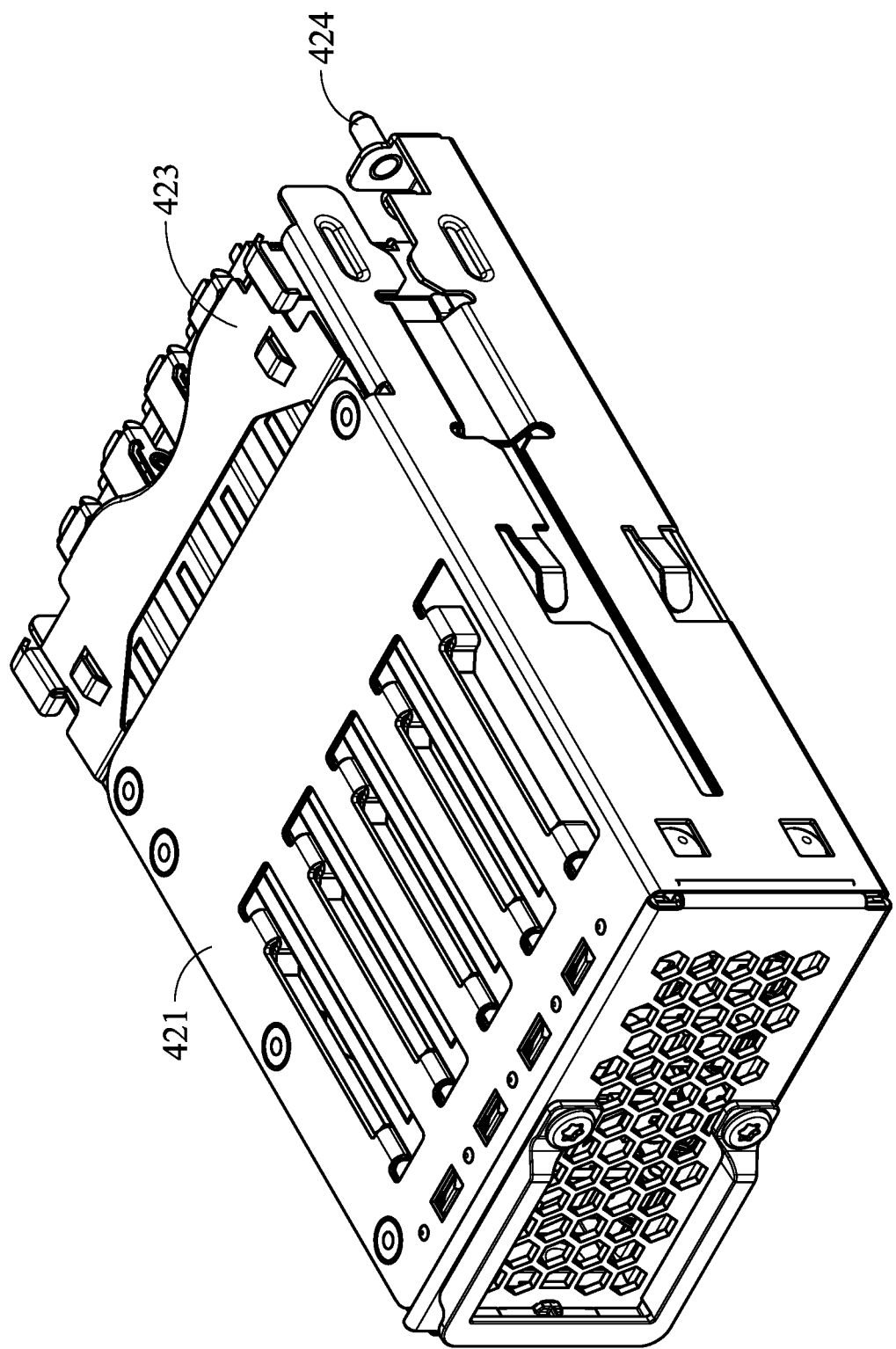
Figure 6C:
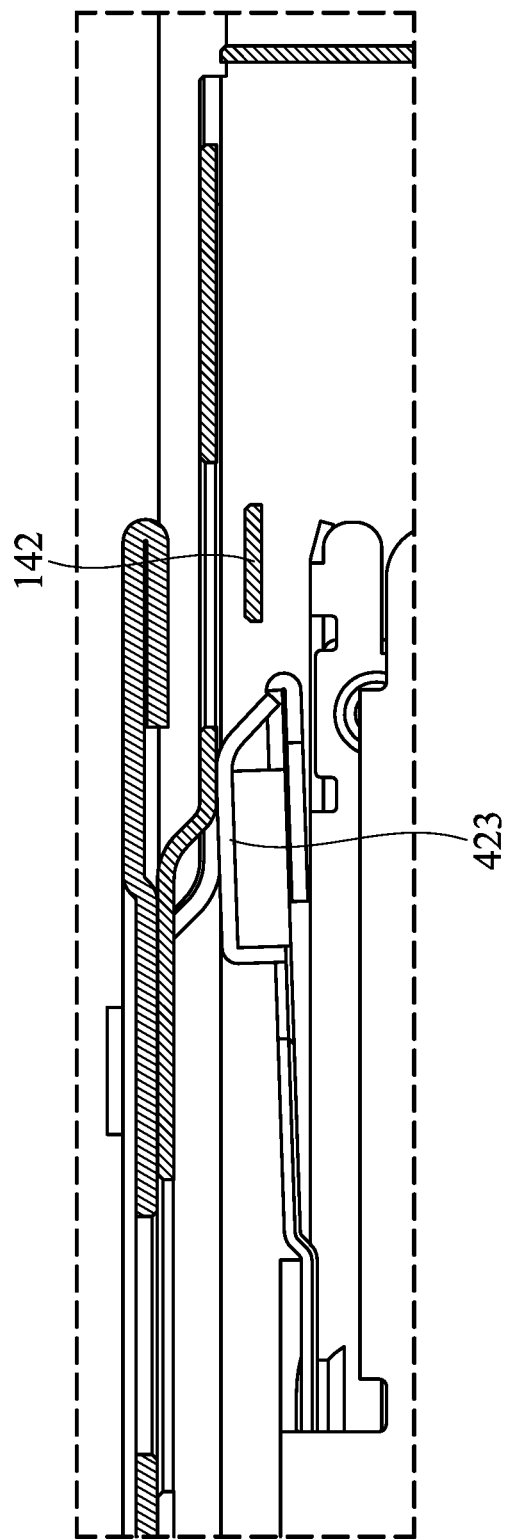
FIGS. 6C and 6D show an elastic sheet and a bracket wedging portion of the embodiment of the invention.
Figure 6D:
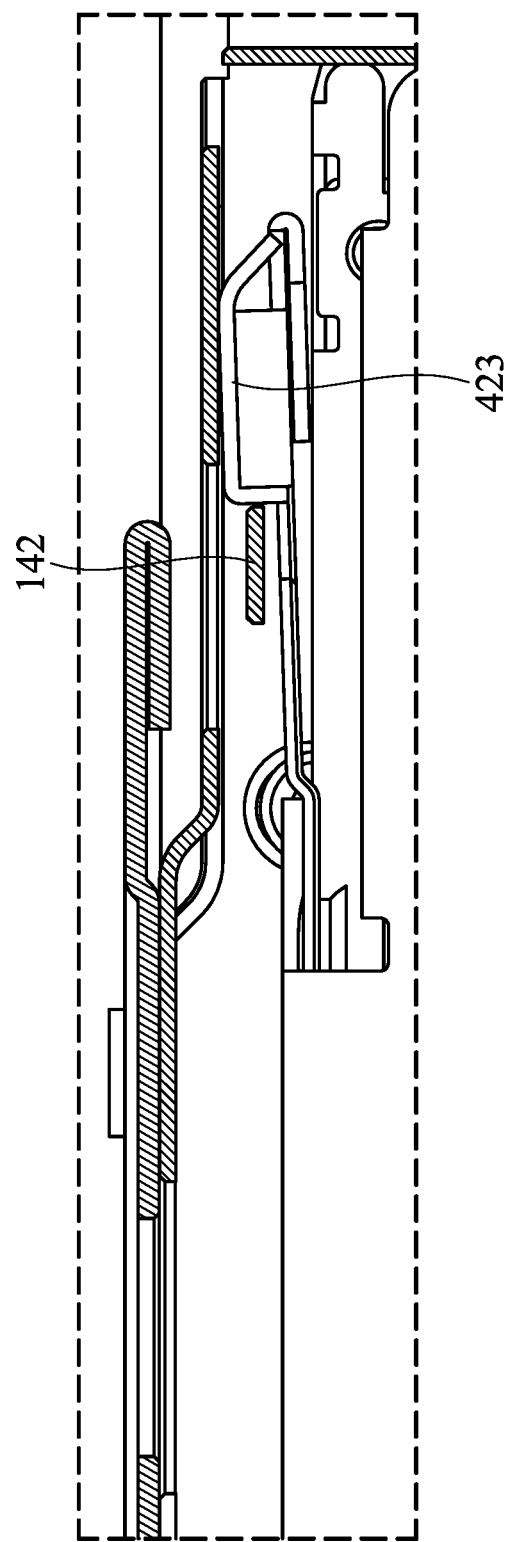

With reference to FIGS. 6A and 6B, in one embodiment, the second storage unit 42 comprises a unit housing 421 and a plurality of solid-state disks 422. The solid-state disks 422 are disposed in the unit housing 421. With reference to FIGS. 1A and 1B, the storage unit mounting area 14 comprises a connection bracket 141. The unit housing 421 is adapted to be disposed in the connection bracket 141, and the solid-state disks 422 are coupled to the third interface module 23.

With reference to FIGS. 6A, 6B, 6C and 6D, in one embodiment, the unit housing 421 further comprises an elastic sheet 423. The connection bracket 141 comprises a bracket wedging portion 142. The elastic sheet 423 is detachably connected (wedged) to the bracket wedging portion 142.

Figure 6E:
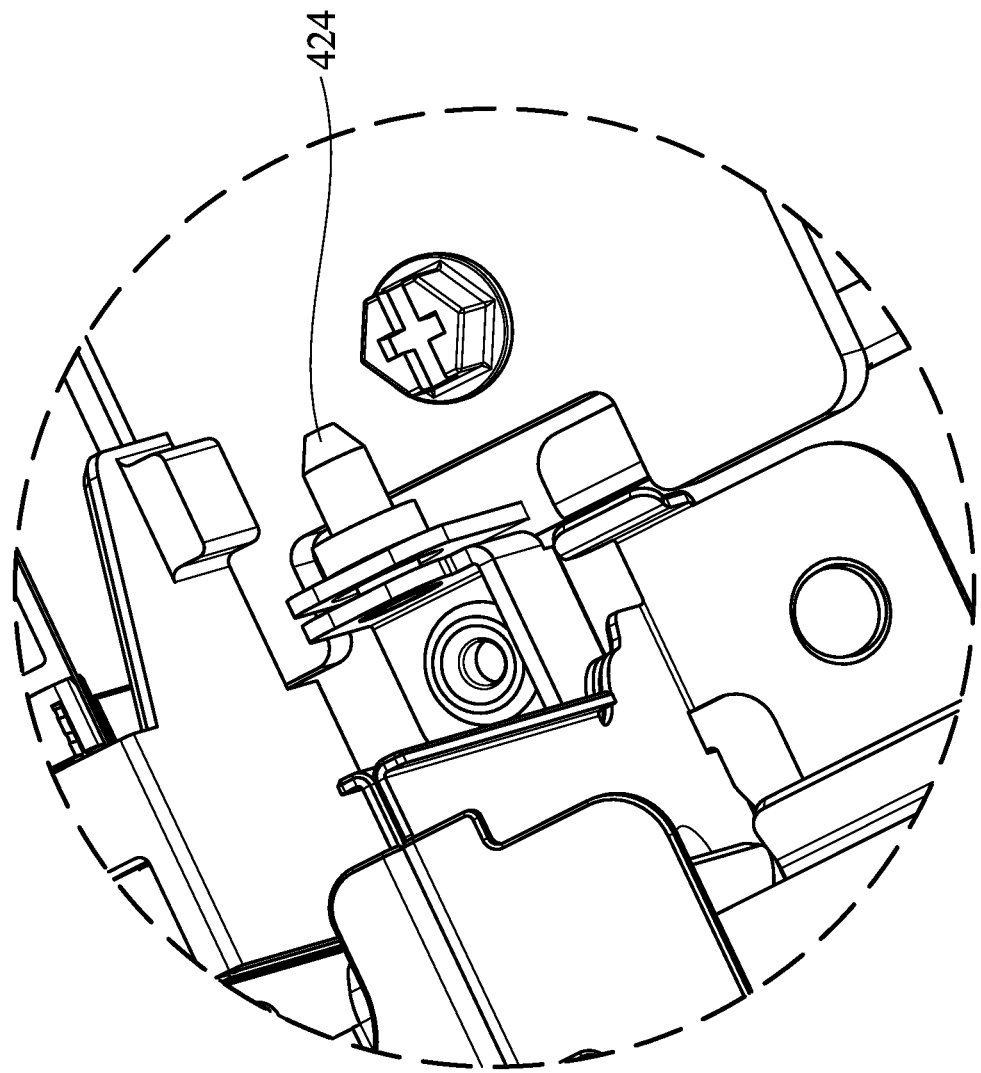
FIG. 6E shows a damage-resisting post of the embodiment of the invention.

With reference to FIGS. 6A, 6B and 6E, in one embodiment, the unit housing 421 further comprises a damage-resisting post 424. The damage-resisting post 424 is disposed above the third interface module 23 or abuts the third interface module 23 to prevent the third interface module 23 from being forcibly removed as the solid-state disks 422 are still coupled to the third interface module 23. The damage-resisting post 424 prevents the solid-state disks 422 from being damaged.

Utilizing the case of the electronic device of the embodiment of the invention, the hard disk and the solid-state disk can be selectively disposed in the electronic device. The internal raid card, the M.2 interface card and the enterprise and data center SSD external card can be fastened conveniently in the well configured space inside the case of the electronic device. The molding cost of the case is decreased, and the space utilization inside the case of the electronic device is improved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A case, adapted to be selectively connected to a first interface module, a second interface module or a third interface module, comprising:
a substrate, wherein the substrate comprises a first connection area and a second connection area, the first connection area is adjacent to the second connection area, the first connection area comprises a first post, and the second connection area comprises a second post and a third post, arranged such that in a first state, the first interface module is disposed in the first connection area, and is connected to the first post, and the second interface module is disposed in the second connection area, and is connected to the second post, and in a second state, the third interface module is disposed in the first connection area and the second connection area, and is simultaneously connected to the first post and the third post,
wherein the substrate further comprises a riser card mounting area, wherein the riser card mounting area connects the first connection area and the second connection area, and the riser card mounting area is adapted to selectively receive a riser card, arranged such that in the first state, the riser card is disposed in the riser card mounting area, and the riser card is coupled to the first interface module.

2. The case as claimed in claim 1, further comprising a fastener, wherein the second connection area comprises a fastening seat, and in the first state, the fastener passes through the second interface module and is affixed to the fastening seat.

3. The case as claimed in claim 2, wherein the second post is located between the first post and the third post.

4. The case as claimed in claim 3, wherein the third interface module comprises a through hole, and in the second state, the second post passes through the through hole.

5. The case as claimed in claim 4, wherein the third interface module comprises a second latch, the second connection area comprises a second wedging unit, and the second wedging unit comprises a second inclined surface and a second abutting surface, arranged such that while the third interface module is being connected to the first post and the third post in a second direction, the second latch is pushed by the second inclined surface, and when the third interface module is completely connected to the first post and the third post, the second latch abuts the second abutting surface, and the first direction is opposite the second direction.

6. The case as claimed in claim 2, wherein the first interface module comprises a first latch, the first connection area comprises a first wedging unit, and the first wedging unit comprises a first inclined surface and a first abutting surface, wherein the substrate is arranged such that while the first interface module is being connected to the first post in a first direction, the first latch is pushed by the first inclined surface, and when the first interface module is completely connected to the first post, the first latch abuts the first abutting surface.

7. The case as claimed in claim 1, wherein the first interface module comprises an internal raid card, and the second interface module comprises an M.2 interface card, and the third interface module comprises an SSD external card or an EDSFF external card.

8. An electronic device, comprising:
a case, adapted to be selectively connected to a first interface module, a second interface module or a third interface module, the case comprising a substrate, wherein the substrate comprises a first connection area and a second connection area, the first connection area is adjacent to the second connection area, the first connection area comprises a first post, and the second connection area comprises a second post and a third post; and arranged such that in a first state of the electronic device, the first interface module is disposed in the first connection area, and is connected to the first post, and the second interface module is disposed in the second connection area, and is connected to the second post, and in a second state of the electronic device, the third interface module is disposed in the first connection area and the second connection area, and is simultaneously connected to the first post and the third post, wherein the substrate further comprises a riser card mounting area, the riser card mounting area connects the first connection area and the second connection area, and the riser card mounting area is adapted to selectively receive a riser card, arranged such that in the first state, the riser card is disposed in the riser card mounting area, and the riser card is coupled to the first interface module.

9. The electronic device as claimed in claim 8, further comprising a fastener, wherein the second connection area comprises a fastening seat, and in the first state, the fastener passes through the second interface module and is affixed to the fastening seat.

10. The electronic device as claimed in claim 9, wherein the second post is located between the first post and the third post.

11. The electronic device as claimed in claim 10, wherein the third interface module comprises a through hole, and in the second state, the second post passes through the through hole.

12. The electronic device as claimed in claim 9, wherein the first interface module comprises a first latch, the first connection area comprises a first wedging unit, and the first wedging unit comprises a first inclined surface and a first abutting surface, arranged such that while the first interface module is being connected to the first post in a first direction, the first latch is pushed by the first inclined surface, and when the first interface module is completely connected to the first post, the first latch abuts the first abutting surface.

13. The electronic device as claimed in claim 12, wherein the third interface module comprises a second latch, the second connection area comprises a second wedging unit, and the second wedging unit comprises a second inclined surface and a second abutting surface, arranged such that while the third interface module is being connected to the first post and the third post in a second direction, the second latch is pushed by the second inclined surface, and when the third interface module is completely connected to the first post and the third post, the second latch abuts the second abutting surface, and the first direction is opposite the second direction.

14. The electronic device as claimed in claim 13, wherein the first interface module comprises an internal raid card, and the second interface module comprises an M.2 interface card, and the third interface module comprises an SSD external card or an EDSFF external card.

15. The electronic device as claimed in claim 8, wherein the substrate further comprises a storage unit mounting area adapted for selectively receiving a first storage unit or a second storage unit, arranged such that in the first state, the first storage unit is disposed in the storage unit mounting area and is coupled to the riser card, and in the second state, the second storage unit is disposed in the storage unit mounting area and is directly connected to the third interface module.

16. The electronic device as claimed in claim 15, wherein the first storage unit comprises a hard disk, and the second storage unit comprises a solid-state disk.

17. The electronic device as claimed in claim 15, wherein the second storage unit comprises a unit housing and a solid-state disk, the solid-state disk is disposed in the unit housing, the storage unit mounting area comprises a connection bracket, the unit housing is disposed in the connection bracket, and the solid-state disk is coupled to the third interface module.

18. The electronic device as claimed in claim 17, wherein the unit housing further comprises an elastic sheet, the connection bracket comprises a bracket wedging portion, and the elastic sheet is detachably connected to the bracket wedging portion.

* * * * *